United States Patent
Ishizuka

[11] Patent Number: 5,875,128
[45] Date of Patent: Feb. 23, 1999

[54] SEMICONDUCTOR MEMORY

[75] Inventor: Nobuhiko Ishizuka, Tokyo, Japan

[73] Assignee: NEC Corporation, Japan

[21] Appl. No.: 885,742

[22] Filed: Jun. 30, 1997

[30] Foreign Application Priority Data

Jun. 28, 1996 [JP] Japan .................................. 8-169392

[51] Int. Cl.$^6$ .................................................. G11C 16/04
[52] U.S. Cl. ............................. 565/185.06; 365/185.05; 365/185.11
[58] Field of Search ....................... 365/185.06, 185.05, 365/104, 185.11, 230.03

[56] References Cited

U.S. PATENT DOCUMENTS

| | | | |
|---|---|---|---|
| 4,597,064 | 6/1986 | Giebel | 365/185.06 |
| 5,392,233 | 2/1995 | Iwase | 365/104 |
| 5,448,518 | 9/1995 | Jinbo | 365/185.06 |
| 5,583,808 | 12/1996 | Brahbmhat | 365/185.06 |
| 5,748,538 | 5/1998 | Lee et al. | 365/185.06 |

FOREIGN PATENT DOCUMENTS

| | | | |
|---|---|---|---|
| 5167042 | 7/1993 | Japan | H01L 27/112 |
| 668683 | 3/1994 | Japan | G11C 16/06 |

*Primary Examiner*—Son T. Dinh
*Attorney, Agent, or Firm*—Hayes, Soloway, Hennessey, Grossman & Hage, P.C.

[57] ABSTRACT

In a semiconductor memory including NOR type cells in which memory cell transistors are located between adjacent bit lines and virtual ground lines, the connection pattern of bit line selecting transistors included, in each of adjacent bit line selection circuits SEL1 and SEL2, to bit line selecting lines, is inverted to that in an adjacent bit line selection circuit. When a memory cell transistor M05 is selected, D6 becomes the bit line and D5 becomes the virtual GND line. At this time, however, since D3 is brought to the precharge level, a current flows through the non-selected transistors M03 and M04 to the virtual GND line D5. But, since this current flows through the two non-selected transistors M03 and M04 to the virtual GND line D5, this current is smaller than the prior art semiconductor memory in which the current flows through only one non-selected transistor.

7 Claims, 3 Drawing Sheets

SEMICONDUCTOR MEMORY

BACKGROUND OF THE INVENTION

1. Field of the Invention

The present invention relates to a semiconductor memory, and more specifically to a semiconductor memory including NOR type cells in which memory cell transistors are located between adjacent bit lines and virtual ground lines.

2. Description of Related Art

In the prior art, the NOR type memory cells have been well known, which are used as memory cells for a large-capacity, high-speed mask read only memory (ROM), and in which memory cell transistors are located between adjacent bit lines and virtual ground (GND) lines, and word lines are located orthogonal to the bit lines and virtual GND lines.

FIG. 1 is a view illustrating the construction of one example of the prior art semiconductor memory using the above mentioned NOR type memory cells. In this drawing, this prior art semiconductor memory is mainly constituted of a NOR type cell array formed of memory cell transistors M01 to Mn8, a selection circuit 1, a precharge circuit 2, a sense amplifier 3, a selection circuit 4, a precharge circuit 5, and virtual GND lines.

In addition, this semiconductor memory includes bit lines and virtual GND lines D1 to D9, word lines WD0 to WDn, bit line selecting transistors S11 to S16, virtual GND line selecting transistors S20 to S26, bit line selecting lines BS0 and BS1, and virtual GND line selecting lines BS2 and BS3.

In the NOR type cells, one block from the bit line selecting transistors S11 to S16 to the virtual GND line selecting transistors S20 to S26, is called one bank, and when one memory cell is selected, one word line in the one bank is brought to a VCC level. Since the selected word line WDk (where "k" is any one of 0 to n) brought to the VCC level is connected to gates of a plurality of (in this example, eight) memory cell transistors Mk1 to Mk8, when the selected cell transistor is an off-cell and an adjacent non-selected cell transistor is an on-cell, a current flows through the selection circuit 1 from the sense amplifier 3 flows through the non-selected cell transistor, with the result that it is deemed as if the on-cell were read out.

In order to prevent this erroneous operation, the system has been conventionally adopted in which the non-selected bit line and the non-selected GND line are connected to the precharge circuits 2 and 5 by the selection circuits 1 and 4, respectively, so that the those lines are brought to the same level as those of the selected bit line, with the result that no current flows from the sense amplifier 3 to the non-selected cell transistor.

Here, assuming that both of the selected memory cell transistor and the non-selected memory cell transistor adjacent to the selected memory cell transistor are on-cells, the operation of the circuit shown in FIG. 1 will be described.

In the case of reading out the memory cell transistor M05 in FIG. 1, the word line WD0, the bit line selecting line BS0 and the virtual GND line selecting line BS3 are pulled up to the VCC level. On the other hand, the bit line selecting line BS1 and the virtual GND line selecting line BS2 are brought to the GND level. At this time, by the selection circuit 1, a bit line Y1 is connected to the precharge circuit 2 and a bit line Y2 is connected to the sense amplifier 3. In addition, by the selection circuit 4, the virtual GND lines VG1 and VG3 are connected to the precharge line 5 and the virtual GND line VG2 is connected to the virtual GND.

Accordingly, as the bit line, D6 is selected which is connected to the bit line Y2 through the turned-on bit line selecting transistor S14, and as the virtual GND line, D5 is selected which is connected to the virtual GND line VG2 through the turned-on virtual GND line selecting transistor S23. Thus, it can be put in a condition of selecting the memory cell transistor M05 having a drain and a source connected to the bit line D6 and the virtual GND line D5, respectively.

In the prior art, in addition, a semiconductor memory is known, which is intended to prevent a current from flowing to the bit line and virtual GND line from the direction of the word line side (Japanese Patent Application Pre-examination Publication No. JP-A-6-68683). This prior art semiconductor memory is constructed as shown in a constructive view of FIG. 2. Memory cell transistors are connected to bit lines 11 to 14 and virtual GND lines 15 to 19 in the form of an array, and metal bit lines 31, 32 and 33 are provided each one for each two bit lines and in common to a plurality of blocks. These metal bit lines are connected to precharge circuits including transistors 41, 42 and 43 between a Y gate circuit 25 and the memory cell array.

In addition, metal virtual GND lines 51 and 52 are provided each one for each two adjacent virtual GND lines, and are connected to precharge circuits 26 and 27, respectively. Furthermore, Reference Numerals 20 and 21 designate a bit line selecting line, and Reference Numerals 22 and 23 denote virtual GND line selecting line. Reference Numeral 24 indicates a word line.

In this prior art semiconductor memory, when a memory cell transistor 101 is read out, the word line 24, the virtual GND line selecting line 22 and the bit line selecting line 20 are pulled up to the VCC level. On the other hand, the virtual GND line selecting line 23 and the bit line selecting line 21 is brought to the GND level. In this condition, only the metal virtual GND line 51 is brought to the GND level, and the other metal virtual GND lines are brought to a precharge level.

Thus, the virtual GND line 16 and 17 are brought to the GND level and the other virtual GND lines 15, 18 and 19 are brought to the precharge level. The bit line 32 is selected by the Y gate circuit 25. Since the bit line selecting line 20 is at the VCC level and the bit line selecting line 21 is at the GND level, the transistor 103 is turned off and the transistor 104 is turned on. Therefore, it is put in a condition in which the bit line 13 is selected to be connected through the transistor 104 to the metal bit line 32. Thus, the memory cell transistor 101 is put in a selected condition.

However, in the prior art semiconductor memory shown in FIG. 1, when both the selected cell transistor Mk1–Mk8 connected to the selected word line WDk, and the adjacent non-selected cell transistor are the on-cell, the current flows from the sense amplifier 3 and the current flows from the precharge circuit 2 flow together into the virtual GND line in common to the two cell transistors, with the result that the current flows from the sense amplifier is reduced, and therefore, a problem is encountered that there is possibility that it is erroneously judged as if the off-cell were read out.

For example, considering the case that the above mentioned memory cell transistor M05 is selected, the lines D6 and D5 are selected as the bit line and the virtual GND line, respectively. At this time, since the bit line D4 is precharged from the precharge circuit 2 through the bit line Y1 and the turned-on bit line selecting transistor S13, a current simultaneously flows to the selected virtual GND line D5 through the non-selected memory cell transistor M04 adjacent to the selected memory cell transistor M05. Therefore, the current flowing into the selected memory cell transistor M05 from the sense amplifier 3 is reduced, with the result that the memory cell transistor M05 is judged as the off-cell.

Furthermore, in the prior art semiconductor memory shown in FIG. 2, since the virtual GND line of the non-selected memory cell transistor adjacent to the selected memory cell transistor is precharged, when the non-selected memory cell transistor is an on-cell, a current flow directly into the selected bit line.

For example, considering that the above mentioned memory cell transistor 101 is selected, when the adjacent non-selected memory cell transistor 102 is an on-cell, since the virtual GND line 18 is at the precharge level, the current flows directly into the bit line 13. As a result, the current flowing from the metal bit line 32 is reduced, so that a problem is encountered that there is possibility that although the memory cell transistor 101 is an on-cell, it is erroneously judged as it were the off-cell.

SUMMARY OF THE INVENTION

Accordingly, it is an object of the present invention to provide a semiconductor memory which has overcome the above mentioned problems of the prior art.

Another object of the present invention is to provide a semiconductor memory capable of reducing the current flowing from the precharged non-selected bit line to the selected memory cell transistor.

In order to achieve the above objects, according to the present invention, there is provided a semiconductor memory including a plurality of memory cell transistors arranged in the form of an array, a plurality of bit lines and virtual ground lines connected to drains and sources of plural memory cell transistors in a column direction, of the plurality of memory cell transistors, a plurality of word lines orthogonal to the bit lines and virtual ground lines and connected to gates of plural memory cell transistors in a row direction, a plurality of bit line selecting lines and a plurality of virtual ground line selecting lines in parallel to the plurality of word lines, a plurality of bit line selection circuits, each provided for plural memory cell transistors included in a plurality of columns, for selecting, in units of a column, as a bit line, the bit lines and virtual ground lines connected to the plural memory cell transistors of the plurality of columns, in accordance with the potential of the bit line selecting lines, each of the plurality of bit line selection circuits being composed of a plurality of bit line selecting transistors, and a virtual ground line selection circuit for selecting, in units of a column, as the virtual ground lines, the bit lines and virtual ground lines connected to the plural memory cell transistors, in accordance with the potential of the virtual ground line selecting lines, the connection pattern of the plurality of bit line selecting transistors, included in each bit line selection circuit, to the bit line selecting lines, being inverted in comparison with that in an adjacent bit line selection circuit.

In the present invention, since the connection pattern of the plurality of bit line selecting transistors, included in each bit line selection circuit, to the bit line selecting lines, is inverted in comparison with that in an adjacent bit line selection circuit, a precharge current flows into the selected virtual ground line connected to the selected memory cell transistor, through a plurality of non-selected memory cell transistors connected to the word line to which the selected memory cell transistor is connected.

DESCRIPTION OF THE PREFERRED EMBODIMENT

Now, an embodiment of the semiconductor memory in accordance with the present invention will be described with reference to the accompanying drawing.

Figure 1:
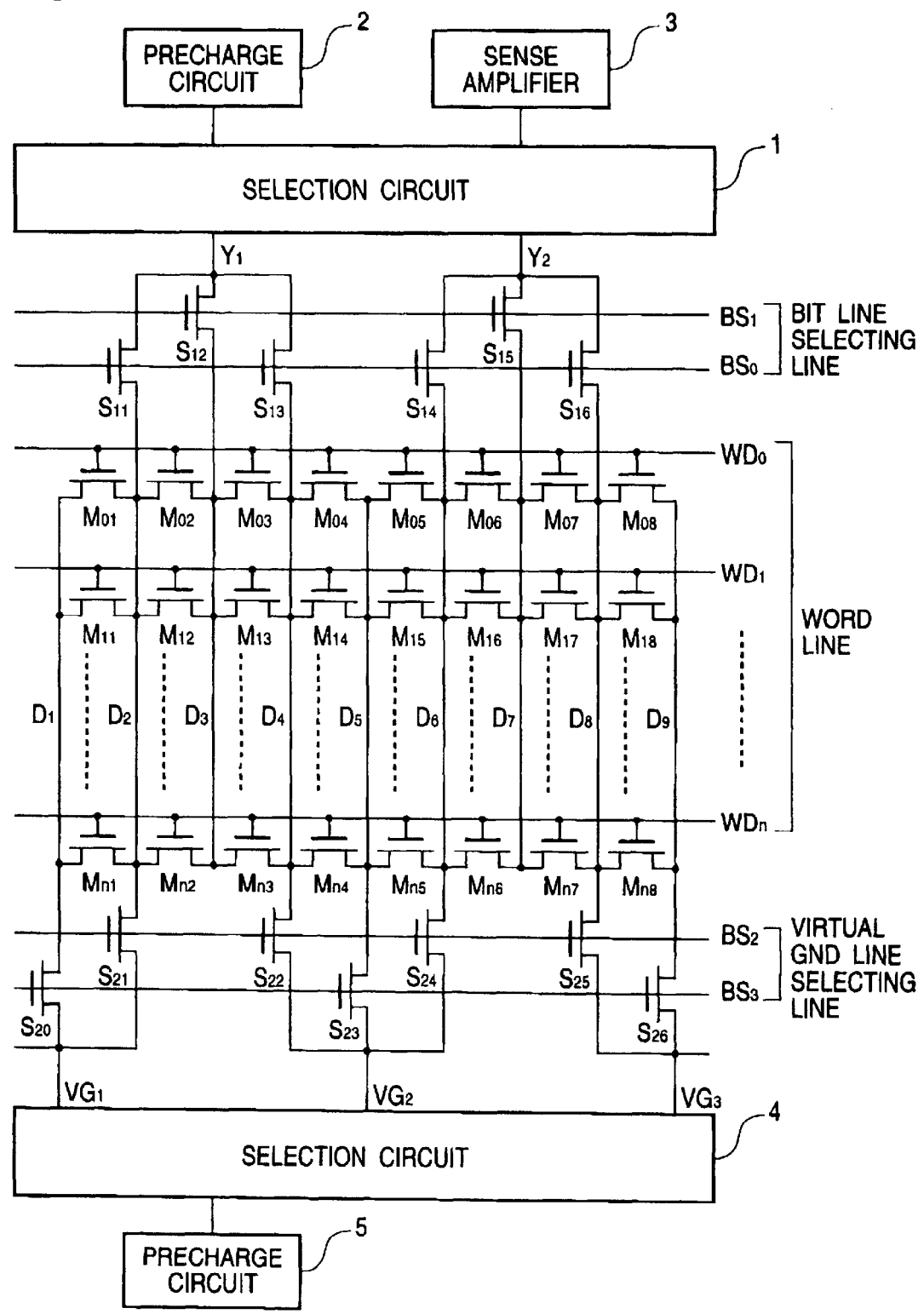
FIG. 1 is a view illustrating the construction of one example of the prior art semiconductor memory.
Figure 2:
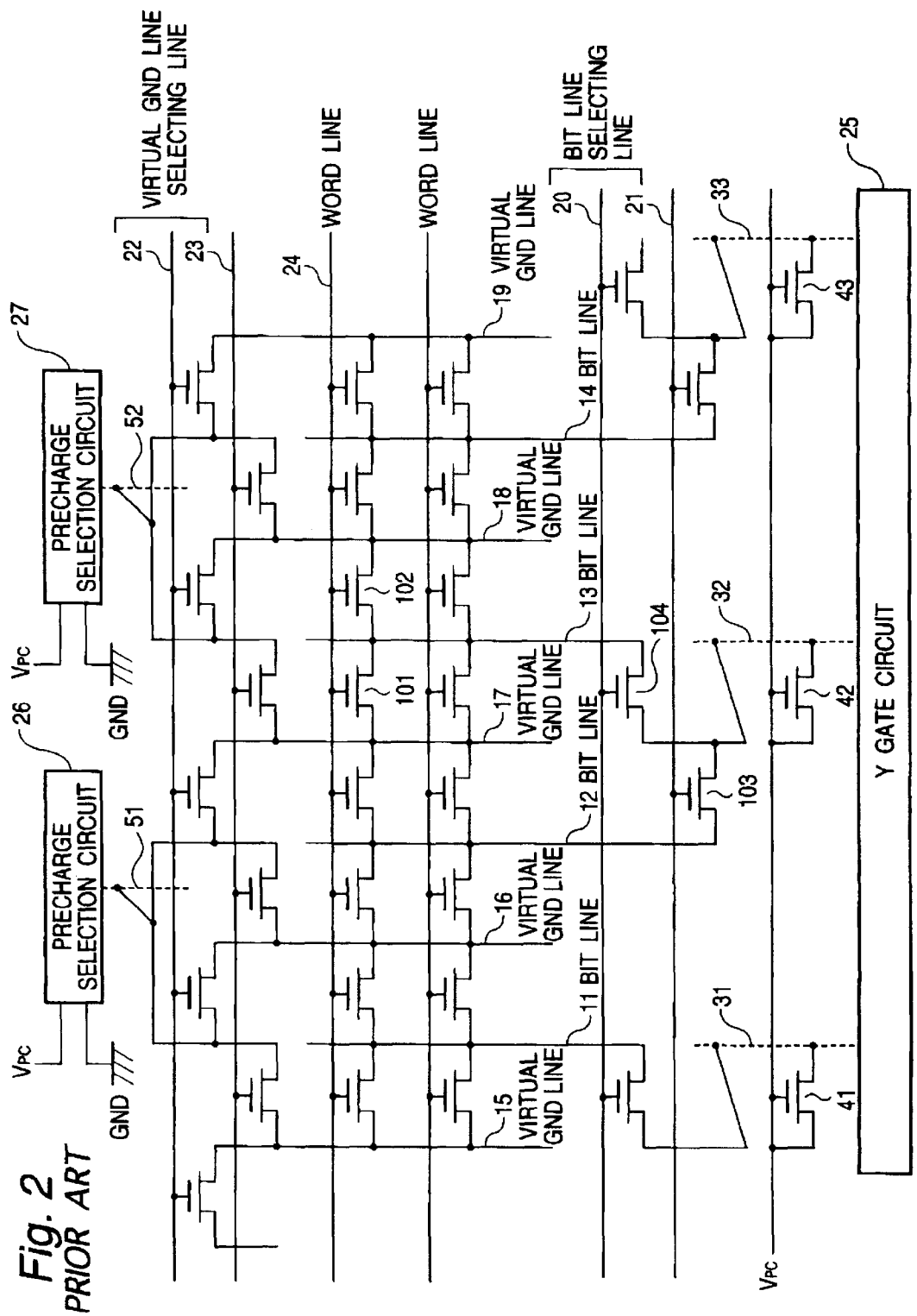
FIG. 2 is a view illustrating the construction of another example of the prior art semiconductor memory.
Figure 3:
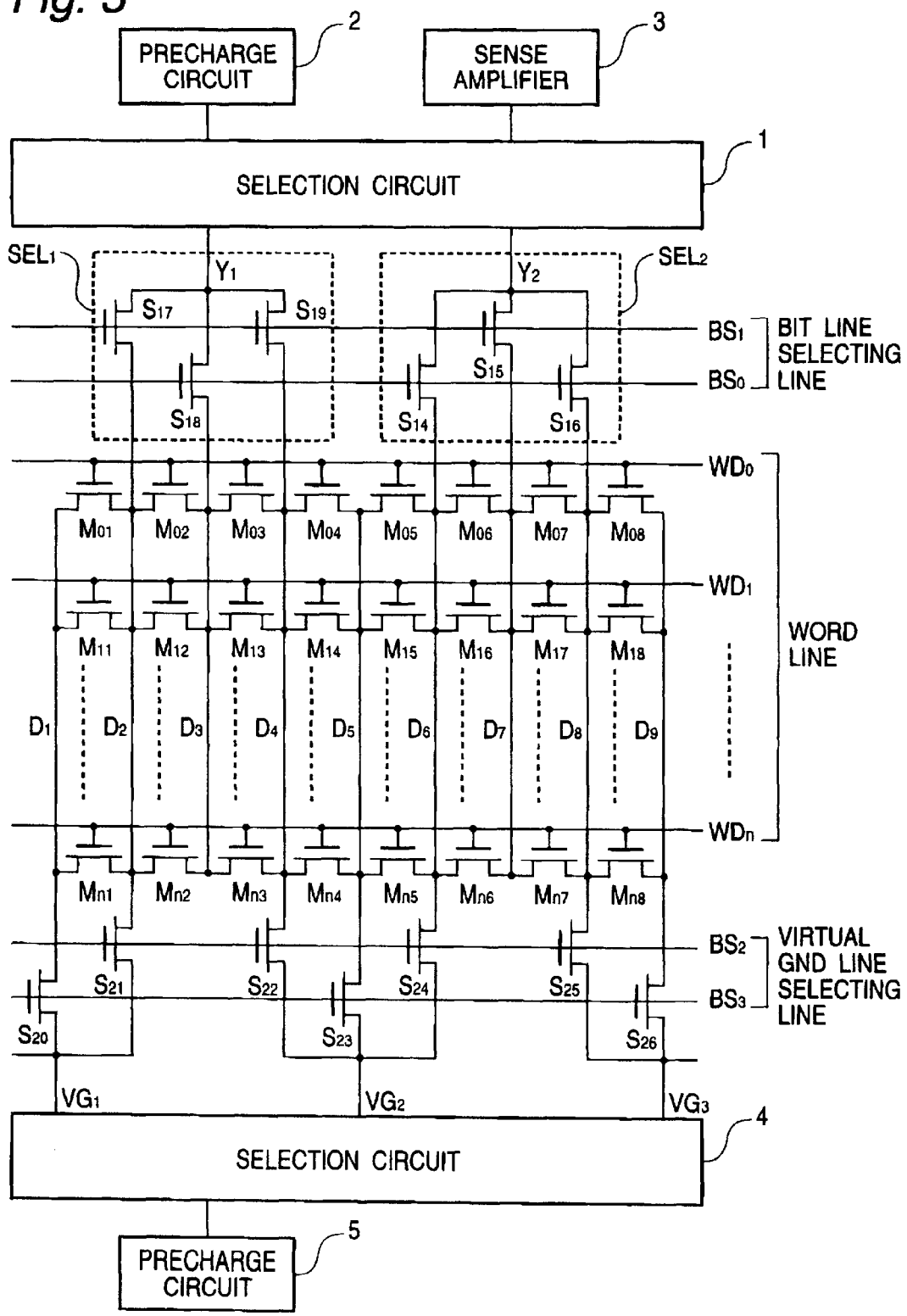
FIG. 3 is a view illustrating the construction of one embodiment of the semiconductor memory in accordance with the present invention.

FIG. 3 is a view illustrating the construction of one embodiment of the semiconductor memory in accordance with the present invention. In this drawing, elements corresponding to those shown in FIG. 1 are given the same Reference Numerals and Signs. In FIG. 3, this semiconductor memory is mainly constituted of a NOR type cell array formed of memory cell transistors M01 to Mn8, a selection circuit 1, a precharge circuit 2, a sense amplifier 3, a selection circuit 4, a precharge circuit 5, and virtual GND lines. In addition, bit lines and virtual GND lines D1 to D9, word lines WD0 to WDn, bit line selecting transistors S11 to S16, virtual GND line selecting transistors S20 to S26, bit line selecting lines BS0 and BS1, and virtual GND line selecting lines BS2 and BS3, are provided similarly to the prior art semiconductor memory shown in FIG. 1.

Furthermore, bit line selection circuits SEL1 and SEL2, each composed of three bit line selecting transistors, are provided each for four columns of memory cell transistors, and select, as a bit line, in units of column, one of the bit lines and virtual GND lines connected to the four columns of memory cell transistors, in accordance with the potential of the bit line selecting lines BS0 and BS1, similarly to the prior art semiconductor memory shown in FIG. 1.

In this embodiment, however, the connection pattern of bit line selecting transistors, in each of adjacent bit line selection circuits SEL1 and SEL2, to the bit line selecting lines, is inverted to the other adjacent bit line selection circuit. Namely, of the bit line selecting transistors S17, S18 and S19 constituting the bit line selection circuit SEL1, a gate of each of S17 and S19 is connected in common to the bit line selecting line BS1, and a source of each of S17 and S19 is connected through the bit line Y1 to the selection circuit 1, and a drain of S17 and S19 are connected to the bit lines and virtual GND lines D2 and D4, respectively. In addition, the bit line selecting transistor S18 is so connected that a gate is connected to the bit line selecting line BS0, and a source is connected through the bit line Y1 to the selection circuit 1, and a drain is connected to the bit line and virtual GND line D3.

On the other hand, of the bit line selecting transistors S14, S15 and S16 constituting the bit line selection circuit SEL2, a gate of each of S14 and S16 is connected in common to the bit line selecting line BS0, and a source of each of S14 and S16 is connected through the bit line Y2 to the selection circuit 1, and a drain of S14 and S16 are connected to the bit lines and virtual GND lines D6 and D8, respectively. In addition, the bit line selecting transistor S15 is so connected that a gate is connected to the bit line selecting line BS1, and a source is connected through the bit line Y2 to the selection circuit 1, and a drain is connected to the bit line and virtual GND line D7.

Now, an operation in the case of selecting the memory cell transistor M05 will be described. The word line WD0 connected to the gate of the memory cell transistors M01 to M08 including M05, the bit line selecting line BS0 connected to the gate of the bit line selecting transistor S14 having the drain connected to the drain (or source) of the memory cell transistor M05, and the virtual GND line selecting line BS3 connected to the gate of the virtual GND line selecting transistor S23 having the source connected to the source (or drain) of the memory cell transistor M05, are pulled up to the VCC level, so that the transistors S14 and S23 are turned on, respectively.

Simultaneously, the bit line selecting line BS1 and the virtual GND line selecting line BS2 are brought to the GND level, so that the bit line selecting transistors S17, S19 and S15 and the virtual GND line selecting transistors S21, S22, S24 and S25 are turned off. In addition, by the selection circuit 1, the bit line Y2 is connected to the sense amplifier 3, and the bit line Y1 is connected to the precharge circuit 2. Furthermore, by the selecting circuit 4, the virtual GND line VG2 is connected to the virtual GND line, and the virtual GND lines VG1 and VG3 are connected to the precharge line 5.

Accordingly, since the turned-on bit line selecting transistor S14 is connected between the bit line Y2 and the line D6 and the turned-on virtual GND line selecting transistor S23 is connected between the virtual GND line VG2 and the line D5, D6 becomes the bit line and D5 becomes the virtual GND line, so that it is put in a condition that the memory cell transistor M05 is selected.

However, since the line D3 is brought to the precharge level through the bit line Y1 and the bit line selecting transistor S18 which is simultaneously turned on at this time, a current flows through the non-selected transistors M03 and M04 to the virtual GND line D5. But, since this current flows through the two non-selected transistors M03 and M04 to the virtual GND line D5, this current is smaller than the prior art semiconductor memory in which the current flows through only one non-selected transistor.

Here, assume that the current flowed from the sense amplifier 3 and the current flowed from the precharge circuit 2 are the same. If both the memory cell transistors M05 and M06 in the semiconductor memory of FIG. 1 are the on-cell, the current flowing from the sense amplifier 3 to the virtual GND line D5 in the semiconductor memory of FIG. 1 becomes a half of the current simply flowed from the sense amplifier 3 when M06 is the off-cell. In this embodiment, on the other hand, since the precharge current flows through the two non-selected transistors M03 and M04 to the virtual GND line D5, the precharge current flowing into the virtual GND line D5 becomes a value smaller than the prior art semiconductor memory.

As mentioned above, according to the present invention, the connection pattern of a plurality of bit line selecting transistors, included in each bit line selection circuit, to the bit line selecting lines, is inverted to that in an adjacent bit line selection circuit, so that the precharge current flows into the selected virtual ground line connected to the selected memory cell transistor, through a plurality of non-selected memory cell transistors connected to the word line to which the selected memory cell transistor is connected. Therefore, the number of the non-selected memory cell transistors through which the precharge current flows, is larger than the prior art, so that the value of the precharge current flowing into the selected virtual GND line can be made small. Accordingly, the reduction of the amount of the current flowing through the selected memory cell transistor can be decreased in comparison with the prior art.

In addition, according to the present invention, the semiconductor memory can be constructed with the same number of transistors as that in the prior art semiconductor memory, since only the connection pattern of a plurality of bit line selecting transistors, included in each bit line selection circuit, to the bit line selecting lines, is inverted to that in an adjacent bit line selection circuit.

I claim:

1. A semiconductor memory including:

a plurality of memory cell transistors arranged in the form of an array;

a plurality of bit lines and virtual ground lines connected to drains and sources of plural memory cell transistors in a column direction, of said plurality of memory cell transistors;

a plurality of word lines orthogonal to said bit lines and virtual ground lines and each connected to gates of plural memory cell transistors in a row direction;

a plurality of bit line selecting lines and a plurality of virtual ground line selecting lines in parallel to said plurality of word lines;

a plurality of bit line selection circuits, each provided for plural memory cell transistors included in a plurality of columns, for selecting, in units of a column, as a bit line, one of the bit lines and virtual ground lines connected to said plural memory cell transistors of said plurality of columns, in accordance with the potential of said bit line selecting lines, each of the plurality of bit line selection circuits being composed of a plurality of bit line selecting transistors; and a virtual ground line selection circuit for selecting, in units of a column, as a virtual ground line, one of the bit lines and virtual ground lines connected to said plural memory cell transistors, in accordance with the potential of said virtual ground line selecting lines, the connection pattern of said plurality of bit line selecting transistors, included in each bit line selection circuit, to said bit line selecting lines, being inverted in comparison with that in an adjacent bit line selection circuit; each said bit line selection circuits being electrically isolated from said adjacent bit line selection circuits.

2. A semiconductor memory claimed in claim 1 further including a first selection circuit for selectively connecting one of a sense amplifier and a first precharge circuit to a first bit line connected to one of a pair of adjacent bit line selection circuits, and also for selectively connecting the other of said sense amplifier and said first precharge circuit to a second bit line connected to the other of said pair of adjacent bit line selection circuits, and a second selection circuit for connecting the virtual ground line selected by said virtual ground line selection circuit to the virtual ground and also for connecting a non-selected virtual ground line to a second precharge circuit.

3. A semiconductor memory as claimed in claim 1, wherein said memory cell transistors being arranged eight to a row, corresponding to one of said word lines.

4. A semiconductor memory as claimed in claim 1, wherein the source region of said memory cell transistors being connected to said virtual ground line selection circuits, and a drain region of said memory cell transistors being connected to said bit line selection circuits.

5. A semiconductor memory as claimed in 1, wherein said bit line selection circuits and said virtual ground line selection circuits being arranged alternatively with respect to one another.

6. A semiconductor memory as claimed in claim 1, wherein each said bit line selecting circuit comprises three transistors for each column of four memory cell transistors.

7. A semiconductor memory as claimed in claim 1, wherein said array of said memory cell transistors comprising NOR-type memory cells.

* * * * *